United States Patent
Suzuki et al.

(10) Patent No.: US 8,466,471 B2
(45) Date of Patent: Jun. 18, 2013

(54) NITRIDE SEMICONDUCTOR FREE-STANDING SUBSTRATE AND METHOD FOR MAKING SAME

(75) Inventors: Takayuki Suzuki, Hitachi (JP); Takeshi Meguro, Kitaibaraki (JP); Takeshi Eri, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 451 days.

(21) Appl. No.: 12/155,759

(22) Filed: Jun. 9, 2008

(65) Prior Publication Data

US 2009/0160026 A1 Jun. 25, 2009

(30) Foreign Application Priority Data

Dec. 22, 2007 (JP) ................................ 2007-331221

(51) Int. Cl.
*H01L 27/15* (2006.01)
(52) U.S. Cl.
USPC ...................... 257/76; 257/103; 257/E29.089
(58) Field of Classification Search
USPC ............... 257/76, 615, 631, E29.089, 85, 103
See application file for complete search history.

(56) References Cited

U.S. PATENT DOCUMENTS

| | | | |
|---|---|---|---|
| 6,413,627 B1 | 7/2002 | Motoki et al. | |
| 6,667,184 B2 | 12/2003 | Motoki et al. | |
| 7,097,920 B2* | 8/2006 | Usui et al. | 428/698 |
| 7,221,037 B2* | 5/2007 | Kitaoka et al. | 257/615 |
| 7,288,830 B2* | 10/2007 | Shibata | 257/615 |
| 2003/0080345 A1 | 5/2003 | Motoki et al. | |
| 2006/0078024 A1* | 4/2006 | Matsumura et al. | 372/46.01 |
| 2007/0096262 A1* | 5/2007 | Takasone | 257/615 |
| 2007/0114513 A1 | 5/2007 | Ohta et al. | |
| 2008/0128706 A1* | 6/2008 | Fujiwara et al. | 257/76 |

FOREIGN PATENT DOCUMENTS

| | | | |
|---|---|---|---|
| JP | 2003-165799 | | 6/2003 |
| JP | 2004-221480 | * | 8/2004 |
| JP | 2006-66496 | | 3/2006 |
| JP | 3788041 | | 4/2006 |
| JP | 2007-142198 | | 6/2007 |

OTHER PUBLICATIONS

Japanese Information Offer Form on Prior Arts dated Feb. 23, 2010 and its English translation thereof.
Information Offer Form on Prior Arts submitted to Japanese Patent Office dated May 25, 2010, with English translation.

\* cited by examiner

*Primary Examiner* — Howard Weiss
*Assistant Examiner* — Tifney Skyles
(74) *Attorney, Agent, or Firm* — McGinn IP Law Group, PLLC (57) ABSTRACT

A nitride semiconductor free-standing substrate includes a nitride semiconductor crystal and an inversion domain with a density of not less than 10/cm$^2$ and not more than 600/cm$^2$ in a section parallel to a surface of the substrate and inside the substrate. A method for making the nitride semiconductor free-standing substrate includes a nitride semiconductor crystal growth step of growing on a heterosubstrate a nitride semiconductor crystal including an inversion domain with a density of not less than 10/cm$^2$ and not more than 600/cm$^2$ by adjusting a growth condition at an initial growth stage of the nitride semiconductor crystal, and a separation step for separating the grown nitride semiconductor crystal from the heterosubstrate to form the nitride semiconductor free-standing substrate.

15 Claims, 5 Drawing Sheets

NITRIDE SEMICONDUCTOR FREE-STANDING SUBSTRATE AND METHOD FOR MAKING SAME

The present application is based on Japanese patent application No. 2007-331221 filed on Dec. 22, 2007, the entire contents of which are incorporated herein by reference.

BACKGROUND OF THE INVENTION

1. Field of the Invention

The invention relates to a nitride semiconductor free-standing substrate, and a method for making the nitride semiconductor free-standing substrate. Particularly, the invention relates to the nitride semiconductor free-standing substrate wherein a warpage of the free-standing substrate is reduced, and a method for making the nitride semiconductor free-standing substrate.

2. Description of the Related Art

A conventional method for making a GaN single crystal substrate as a nitride semiconductor free-standing substrate is conducted such that a nitride semiconductor layer is heteroepitaxially grown by using a vapor-phase growth method on a heterosubstrate, which is different from the nitride semiconductor, such as a sapphire substrate, a silicon substrate, and a gallium arsenide substrate, and the heterosubstrate is then removed by polishing, etching or peeling to leave only the nitride semiconductor layer, whereby a nitride semiconductor free-standing substrate is formed (e.g., see JP-B-3788041). This method involves a step that a mask having dotted windows aligned in [11-2] direction at constant intervals and shifted a half pitch in [−110] direction is formed on a (111) GaAs substrate, a GaN buffer layer is grown on the mask formed, GaN crystal is epitaxially grown on the GaN buffer layer, and the GaAs substrate and the mask are then removed to have the GaN free-standing substrate.

However, in the method described in JP-B-3788041, many defects arise at the initial stage of the growth of the nitride semiconductor crystal since the nitride semiconductor crystal is grown on the heterosubstrate mismatching to the nitride semiconductor. Thus, when the heterosubstrate is separated from the nitride semiconductor crystal, there occurs a difference between the defect density at the surface of the nitride semiconductor crystal and the defect density at the bottom thereof. Due to the difference in defect density, internal stress is left in the nitride semiconductor crystal. Consequently, a warpage arises in the nitride semiconductor free-standing substrate after separating the heterosubstrate.

In the nitride semiconductor free-standing substrate having such warpage, plane orientations are not orientated in a uniform direction in a plane thereof. Therefore, dispersion must be generated among in-plane off-angles even when the nitride semiconductor free-standing substrate is flattened by polishing or the like. In producing a light-emitting device by using the nitride semiconductor free-standing substrate having the dispersion among in-plane off-angles, dispersion will be generated in its emission wavelength due to the dispersion among in-plane off-angles. Along with this, a further problem will arise that the production yield is reduced with respect to the light-emitting device to emit light of a desired wavelength.

SUMMARY OF THE INVENTION

It is an object of the invention to provide a nitride semiconductor free-standing substrate that can have a significantly reduced warpage, and a method for making the nitride semiconductor free-standing substrate.

(1) According to one embodiment of the invention, a nitride semiconductor free-standing substrate comprises:

a nitride semiconductor crystal; and an inversion domain with a density of not less than $10/cm^2$ and not more than $600/cm^2$ in a section parallel to a surface of the substrate and inside the substrate.

In the above embodiment (1), the following modifications and changes can be made.

(i) The surface of the substrate comprises an inversion domain with a density of not less than $0/cm^2$ and not more than $200/cm^2$.

(2) According to another embodiment of the invention, a method of making a nitride semiconductor free-standing substrate comprises:

a nitride semiconductor crystal growth step of growing on a heterosubstrate a nitride semiconductor crystal comprising an inversion domain with a density of not less than $10/cm^2$ and not more than $600/cm^2$ by adjusting a growth condition at an initial growth stage of the nitride semiconductor crystal; and a separation step for separating the grown nitride semiconductor crystal from the heterosubstrate to form the nitride semiconductor free-standing substrate.

In the above embodiment (2), the following modifications and changes can be made.

(ii) The nitride semiconductor crystal growth step comprises a step of, after growing the nitride semiconductor crystal comprising the inversion domain on the heterosubstrate, continuously growing the nitride semiconductor crystal comprising an inversion domain with a density of not less than $0/cm^2$ and not more than $200/cm^2$ on a surface of the nitride semiconductor crystal.

(iii) The method further comprises:

a step of removing a part of the nitride semiconductor crystal comprising the inversion domain in the nitride semiconductor free-standing substrate from the separated nitride semiconductor free-standing substrate after the separation step.

BRIEF DESCRIPTION OF THE DRAWINGS

The invention will be explained in more detail in conjunction with appended drawings, wherein.

DESCRIPTION OF THE PREFERRED EMBODIMENTS

Preferred embodiments of the present invention will be described hereinafter by referring to the accompanying drawings.

First Embodiment

Figure 1:
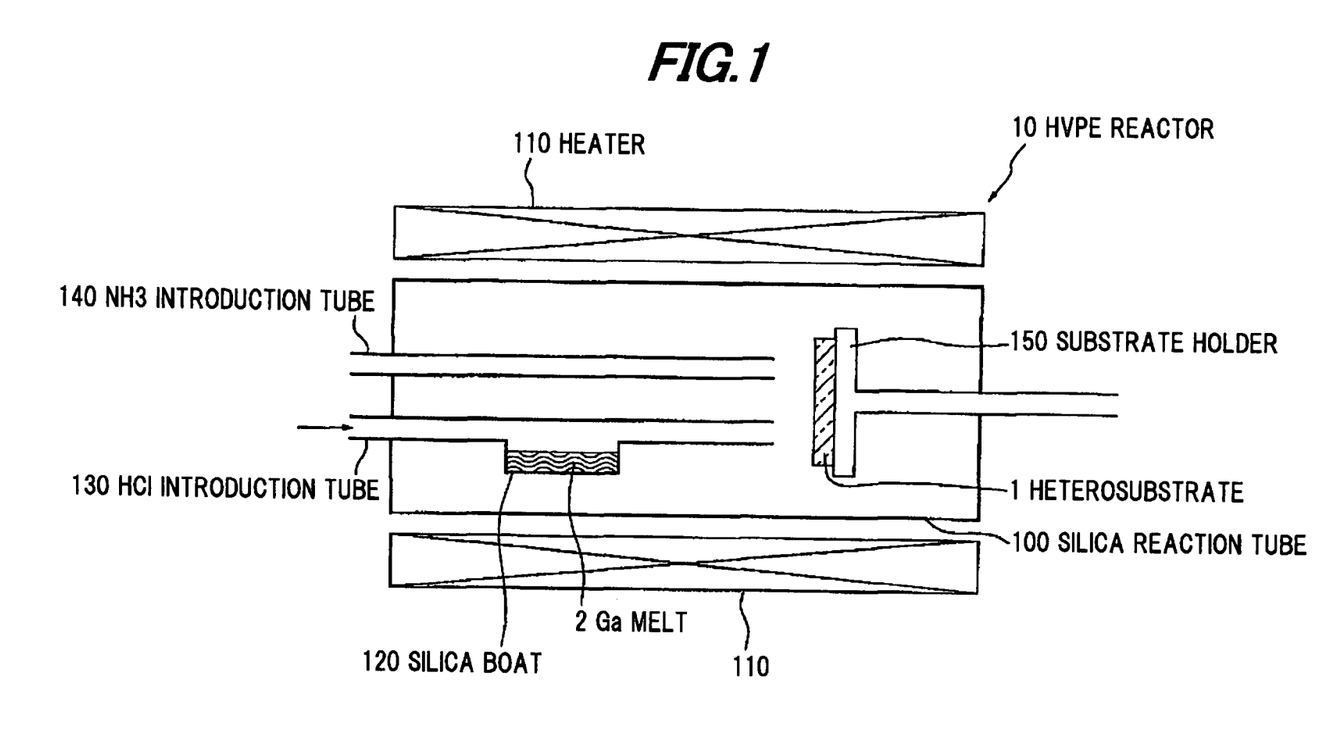
FIG. 1 is a schematic view showing an HVPE reactor used for the method for making a nitride semiconductor free-standing substrate according to a first embodiment of the present invention.

FIG. 1 is a schematic view showing an HVPE reactor used for the method for making a nitride semiconductor free-standing substrate according to the first embodiment of the invention.

Constitution of HVPE Reactor 10

The HVPE reactor 10, served for a halide vapor phase epitaxy (HVPE) apparatus to be used for the method for making a nitride semiconductor free-standing substrate according to the first embodiment, is provided with a silica reactor tube 100 made from silica, a silica boat 120 located inside the silica reactor 100 at a predetermined position and loaded with the raw material of a nitride semiconductor free-standing substrate, a HCl introduction tube 130 served for an introduction tube of halogen gas located at the position near to the silica boat 120, a substrate holder 150 for holding a heterosubstrate 1 on the surface of which single crystals of a nitride semiconductor are formed, and a $NH_3$ introduction tube 140 served for an N (nitrogen) source feed tube located at the position near to the heterosubstrate 1. Further, the HVPE reactor 10 has a heater 110 for surrounding the circumference of the silica reactor tube 100 to supply heat to the inside of the silica reactor tube 100.

In the present embodiment, the silica boat 120 is loaded with Ga metal as one of the raw metals of nitride semiconductor crystals. The Ga metal is heated by the heater 110 to be molten, so that a Ga melt 2 is obtained. As an example, the heterosubstrate 1 according to the present embodiment is a sapphire substrate having two inch diameter, and (0001) plane, i.e. c-face. The sapphire substrate is secured on the substrate holder 150 in such that the surface of the sapphire substrate is perpendicular to the longitudinal direction of the silica reactor tube 100. The position at which the substrate holder 150 is to be positioned is adjusted in such that the surface of the sapphire substrate is distant from the silica boat 120 by a predetermined distance.

Moreover, the nitride semiconductor free-standing substrate made by the method for making a nitride semiconductor free-standing substrate according to the present embodiment is, as an example, the free-standing substrate formed from the nitride semiconductor represented by $In_xAl_yGa_{1-x-y}Ga_{1-x-y}N$ ($0 \leq x$, $0 \leq y$, $x+y \leq 1$). The nitride semiconductor free-standing substrate according to the present embodiment is, for example, a GaN free-standing substrate.

Figure 2:
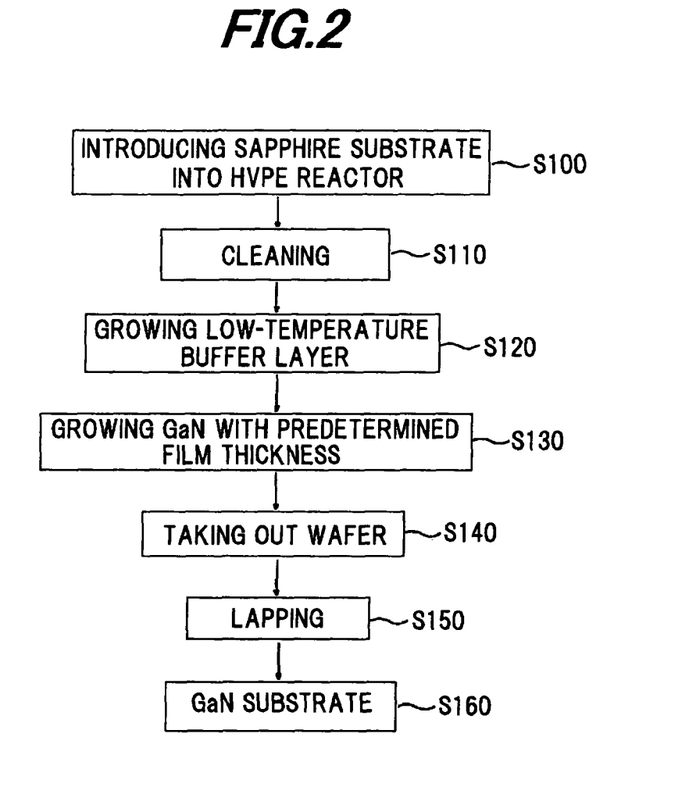
FIG. 2 is a flowchart illustrating a process of making a nitride semiconductor free-standing substrate according to the first embodiment of the invention.

FIG. 2 is a flowchart illustrating a process of making the nitride semiconductor free-standing substrate according to the first embodiment of the invention.

Method for Making Nitride Semiconductor Free-Standing Substrate

First, a sapphire substrate is introduced into the HVPE reactor 10 (S100). Specifically, the sapphire substrate is secured onto the substrate holder 150. Successively, the silica boat 120 loaded with a Ga metal is heated at 900° C. to melt the Ga metal, whereby the Ga melt 2 is obtained. Furthermore, a predetermined region wherein the sapphire substrate is located is heated at 1100° C., consequently the surface of the sapphire substrate is cleaned for ten minutes in a hydrogen carrier gas atmosphere (S110). After completing the cleaning, the temperature of the predetermined region wherein the sapphire substrate is located is lowered up to 500° C.

In succession, an HCl gas is introduced together with a hydrogen carrier gas from the HCl introduction tube 130. When the HCl gas is introduced together with a hydrogen carrier gas from the HCl introduction tube 130, the Ga melt 2 in the silica boat 120 reacts with the HCl gas to produce GaCl. Then, the GaCl produced is supplied onto the sapphire substrate together with the hydrogen carrier gas. On one hand, a nitrogen carrier gas is supplied together with $NH_3$ gas onto the sapphire substrate. As a consequence, a low-temperature buffer layer formed from GaN is grown on the sapphire substrate (S120). As an example, the low-temperature buffer layer is grown in such that the film thickness thereof is 30 nm.

After growing the low-temperature buffer layer, the predetermined region wherein the sapphire substrate is located is heated at 1050° C. Then, GaCl is supplied together with the hydrogen carrier gas onto the low-temperature buffer layer through the HCl introduction tube 130, and also $NH_3$ gas is supplied from the $NH_3$ introduction tube 140 together with the nitrogen carrier gas. For example, GaCl and $NH_3$ are supplied in such condition that the growth rate of GaN is 100 μ/hour. In this condition, as a result of implementing GaN growth for eight hours as an example, a GaN crystal having 800 μm film thickness as a predetermined film thickness is grown on the low-temperature buffer layer (S130). Thus, an epitaxial wafer wherein the low-temperature buffer layer and the GaN crystal having the predetermined film thickness are formed on the sapphire substrate is obtained.

Thereafter, the resulting epitaxial wafer is taken out from the HVPE reactor 10 (S140). The epitaxial wafer taken out is transferred to a polishing device. Then, the epitaxial wafer transferred to the polishing device is polished with a diamond abrasive. Specifically, the side of the sapphire substrate is lapped, while the sapphire substrate and the low-temperature buffer layer are removed (S150). As a consequence, the GaN substrate being a GaN free-standing substrate having about 800 μm film thickness and about 50 mm diameter as the nitride semiconductor free-standing substrate made by the method for making a nitride semiconductor free-standing substrate according to the first embodiment of the invention is separated from the sapphire substrate (S160).

The GaN free-standing substrate obtained by the method for making a nitride semiconductor free-standing substrate according to the first embodiment has a warped outline wherein the reverse face thereof shapes a convex surface. When a difference in the heights between that of the GaN free-standing substrate and that of the reverse face in the outer circumference of the GaN free-standing substrate, i.e. a warpage amount is measured with use of a laser displacement meter, it is around 100 μm. In succession, the surface and the reverse face of the resulting GaN free-standing substrate are polished to form a flat GaN free-standing substrate of 400 μm thickness. When off-angles in the resulting GaN free-standing substrate of 400 μm thickness are measured, the dispersion of the off-angles in the planes of the GaN free-standing substrate is 0.7 degree (the maximum value–the minimum value).

When the GaN free-standing substrate of 400 μm thickness obtained by the method for making a nitride semiconductor free-standing substrate according to the first embodiment is cleaved to TEM-observe the cleaved surface, streaked regions which are considered to be inversion domains are observed. The inversion domains mean regions the polarities thereof are different from one another. In addition, when the GaN free-standing substrate is subjected to the polarity judgment due to CBED (Convergent Beam Electron Diffraction), it is confirmed that the streaked regions are inversion domains. Further, as to the density of the inversion domains of the GaN free-standing substrate according to the first embodiment, it is confirmed that the inversion domains exist inside the substrate at the density of $100/cm^2$ in the section parallel to the surface of the GaN free-standing substrate. Besides, it is confirmed that the inversion domains exist on the surface of the substrate at the density of $100/cm^2$.

The details of a measuring method of inversion domains in the interior of the GaN free-standing substrate are as follows. Namely, a section parallel to the surface (or the reverse face) of the substrate is formed at the height position of 50 μm from the reverse face (the surface opposite to growth surface) of the GaN free-standing substrate. Then, the density of inversion domains is measured in the section formed.

It is impossible to grow epitaxially a nitride semiconductor crystal on a heterosubstrate such as sapphire having a significantly different lattice constant from that of the nitride semiconductor in a condition wherein the lattice structure of the heterosubstrate is retained as it is. Consequently, initial nuclei of the nitride semiconductor crystals appear at arbitrary positions on the heterosubstrate, and the nitride semiconductor crystals grow from the initial nuclei as the originations in the case that the nitride semiconductor crystals grow on the heterosubstrate. Then, the crystals adjacent to each other fuse together so that they grow into a crystal film being continuous two-dimensionally and without undulation. In such heteroepitaxial crystals, many crystal defects appear in the initial stage of growth stage; and inversion domains appear in the stage of initial nucleus formation dependent on a growth condition. In the present embodiment, such a condition that inversion domains are allowed to positively appear at the time of crystal growth is adopted.

Comparative Example

The method for making a nitride semiconductor free-standing substrate according to the comparative example is the same as that of the method for making a nitride semiconductor free-standing substrate according to the first embodiment except that the surface of a sapphire substrate is cleaned (S110), thereafter a temperature of a predetermined region wherein the sapphire substrate is located is lowered up to 500° C., and then, the surface of the sapphire substrate is nitrided. Accordingly, the detailed explanation of the comparative example is omitted except for the points of difference. The nitriding step of the surface of the sapphire substrate is a step for conducting for the purpose to prevent an appearance of inversion domains in the GaN crystal layer formed on the sapphire substrate.

The nitration of the surface of a sapphire substrate is implemented as follows. Namely, first, $NH_3$ gas is supplied onto the sapphire substrate at 1 L/min. from a $NH_3$ induction pipe 140 being an N-source feed pipe positioned in the vicinity of the sapphire substrate, whereby the predetermined region containing the surface of the sapphire substrate is in a mixed atmosphere of $NH_3$ and hydrogen. Then, when the surface of the sapphire substrate is exposed to the mixed atmosphere of $NH_3$ and hydrogen for three minutes, the surface of the sapphire substrate is nitrided. Successively, a GaN low-temperature buffer layer is formed on the surface of the nitrided sapphire substrate as in the first embodiment. The subsequent steps are the same as that of the first embodiment.

The GaN substrate obtained by the method for making a nitride semiconductor free-standing substrate according to the comparative example has a warped outline wherein the reverse face thereof shapes a convex surface. When a warpage amount of the GaN substrate is measured with use of a laser displacement meter, it is around 150 μm. In succession, the surface and the reverse face of the resulting GaN substrate according to the comparative example are polished to form a flat GaN substrate of 400 μm thickness. When off-angles in the resulting GaN substrate of the comparative example of 400 μm thickness are measured, the dispersion of the off-angles in the planes of the GaN substrate is 0.9 degrees (the maximum value–the minimum value).

Advantages of the First Embodiment

The point of difference between the comparative example and the first embodiment is in whether or not the surface of a sapphire substrate is nitrided. In the first embodiment, a low-temperature buffer layer is formed on the sapphire substrate in the growth condition of nitride semiconductor crystals wherein inversion domains appear easily, in other words, the formation of the low-temperature buffer layer is made without nitriding the surface of the sapphire substrate. As a consequence, a nitride semiconductor free-standing substrate having inversion domains can be formed in accordance with the method for making a nitride semiconductor free-standing substrate of the first embodiment. Furthermore, the nitride semiconductor free-standing substrate formed in the first embodiment has less warpage than that of the nitride semiconductor free-standing substrate according to the comparative example which is formed through a step for nitriding the surface of a sapphire substrate.

The present embodiment is made by such finding knowledge by the inventor(s) that one of the growth conditions wherein inversion domains appear easily in the initial stage of nitride semiconductor crystals is in that the surface of a heterosubstrate 1 is not nitrided.

As a result, the dispersion in off-angles of the nitride semiconductor free-standing substrate according to the first embodiment is less than that of the free-standing substrate according to the comparative example. Accordingly, the dispersion in the wavelength of the light emitted from a light-emitting device such as LED, and LD may be reduced in the case that the light-emitting device is made from the nitride semiconductor free-standing substrate obtained in the first embodiment. In addition, the first embodiment can remarkably contribute to improve the yield ratio in case of making the light-emitting device.

Second Embodiment

Figure 3:
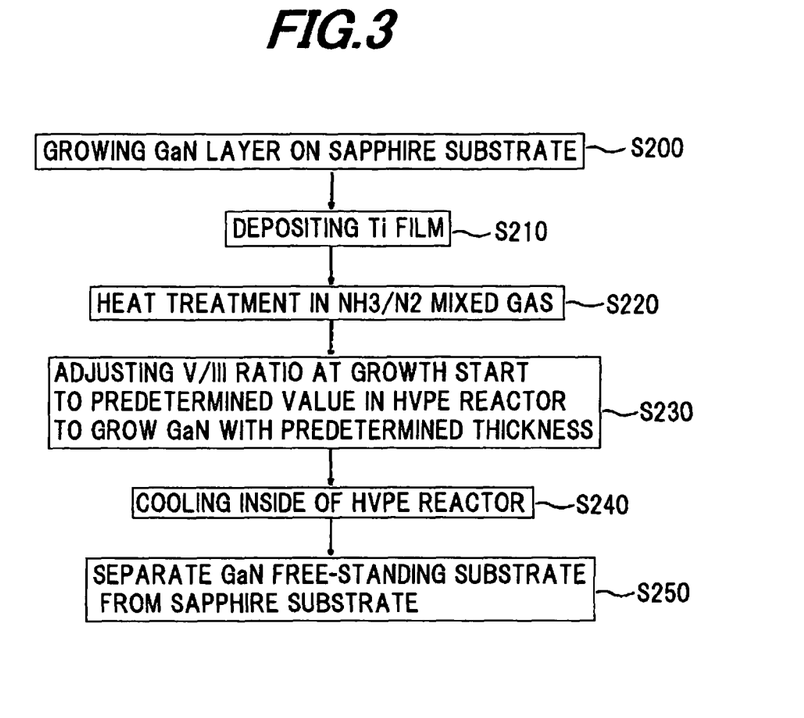
FIG. 3 is a flowchart illustrating a process of making a nitride semiconductor free-standing substrate according to a second embodiment of the present invention.

FIG. 3 is a flowchart illustrating a process of making a nitride semiconductor free-standing substrate according to the second embodiment of the invention.

In the second embodiment, a void-assisted separation method (VAS method) is applied. In the VAS method, a thin film of titanium nitride (TiN) having a mesh structure is formed between a sapphire substrate and a GaN growth layer to implement a crystal growth. A GaN epitaxial layer is grown on the sapphire substrate by applying the VAS method, and thereafter the sapphire substrate is removed to obtain a GaN free-standing substrate.

Specifically, first, as an example, an undoped GaN layer which is not doped with an impurity is formed on a sapphire substrate being a heterosubstrate having c-face and two inch diameter by applying a metal organic vapor phase epitaxy (MOVPE) method (S200). Trimethyl gallium (TMG) and $NH_3$ are used for raw materials of a GaN layer to be formed. A film thickness of the undoped GaN layer to be formed is 300 nm as an example.

Next, as an example, a Ti layer being a Ti thin film is formed on the GaN layer formed by depositing Ti having 20 nm film thickness in accordance with a vacuum deposition method (S210). Then, the sapphire substrate having a GaN layer on which the Ti layer is formed is transferred to an electric reactor. Successively, inside the electric reactor is made to be a mixed gas atmosphere consisting of 20% of $NH_3$ and 80% of $H_2$, and the sapphire substrate having a GaN layer on which the Ti layer is formed is heat-treated at 1050° C. for twenty minutes (S220). As a result, a part of the undoped GaN layer is etched to form void-assisted GaN layer having airspaces of a high density, and further to nitride the Ti layer. The nitrided Ti layer changes into a void-formed TiN layer on the surface of which high-density submicron fine apertures are formed.

In succession, a substrate holder 150 in an HVPE reactor 10 is loaded with the sapphire substrate having the void-assisted GaN layer and the void-formed TiN layer. Then, a V/III ratio being a ratio of a V raw material and a III raw material at the time of starting growth is adjusted to a predetermined value to form a GaN film having a predetermined thickness (S230). Specifically, the V/III ratio at the time of starting growth is set to 20 so that a GaN film having 800 μm thickness is formed on a sapphire substrate having a void-assisted GaN layer and a void-formed TiN layer.

The formation condition of GaN is as follows. First, a silica boat 120 loaded with Ga metal is heated at 900° C., and further the side of the substrate holder 150 is heated at 1100° C. Moreover, a mixed gas consisting of 5% of $H_2$ and 95% of $N_2$ is used as a carrier gas; and GaCl gas produced by reacting HCl gas with the Ga metal and $NH_3$ gas are used as raw material gases. The raw material gases are set in such that a V/III ratio at the time of starting the growth of GaN is 20. The $NH_3$ gas is supplied simultaneously with the GaCl gas onto the sapphire substrate.

The growth of GaN proceeds as follows. First, GaN crystal nuclei are grown on the TiN layer in a three dimensional island shape. Then, GaN crystals grow from the respective island-shaped crystals as the originations in the lateral direction to connect together, whereby the surface continues to be flattened. The degree of progress in the growth of GaN crystals is confirmed by observing microscopically the surface and cross section of the sapphire substrate taken out outside the HVPE reactor in every respective growth periods of time by setting variously the growth periods of time of GaN crystals.

After completing the growth of GaN crystals, the interior of the HVPE reactor 10 is cooled (S240). In the course of cooling the interior of the HVPE reactor 10, the GaN layer formed on the TiN layer exfoliates naturally from the boundary between the GaN layer and the void-assisted GaN layer (S250). As a result, a GaN free-standing substrate is formed as a nitride semiconductor free-standing substrate having 800 μm thickness.

The GaN free-standing substrate formed in accordance with the second embodiment has many concaves on the surface thereof and a warpaged outline wherein the reverse face thereof shapes a convex surface. When a warpage amount of the GaN free-standing substrate formed by the second embodiment is measured with use of a laser displacement meter, it is around 10 μm. In succession, the surface and the reverse face of the resulting GaN free-standing substrate are polished to form a flat GaN free-standing substrate having 400 μm thickness. When off-angles in the resulting GaN free-standing substrate are measured, the dispersion of the off-angles in the planes of the GaN free-standing substrate is 0.2 degree (the maximum value–the minimum value).

Furthermore, when the resulting GaN free-standing substrate is cleaved to TEM-observe the cleaved surface, a number of streaked regions which are considered to be inversion domains are confirmed. A number of these streaks in the regions reach up to the surface of the GaN free-standing substrate. When the polarity detection by means of CBED is implemented, it is confirmed that these regions are inversion domains. Moreover, it is confirmed that the inversion domains of the GaN free-standing substrate according to the second embodiment exist inside the substrate in a section parallel to the surface of the GaN free-standing substrate at a density of 300/cm$^2$, and on the surface of the substrate at a density of 300/cm$^2$.

Advantages of the Second Embodiment

In the second embodiment, a growth condition wherein inversion domains appear easily, i.e. a high V/III ratio condition is applied. Consequently, a nitride semiconductor free-standing substrate having inversion domains can be formed according to the method for making a nitride semiconductor free-standing substrate according to the second embodiment.

The present embodiment is based on such finding knowledge by the inventor(s) that one of growth conditions wherein inversion domains appear easily at the initial stage of growing nitride semiconductor crystals is in that a V/III ratio is made to be high, while a condition wherein the inversion domains disappear easily is in that the V/III ratio is made to be low.

The nitride semiconductor free-standing substrate formed in the second embodiment exhibits a very smaller warpage than that of the nitride semiconductor free-standing substrate according to the comparative example which is formed in such that the V/III ratio at the initial stage of growth is made to be lower than that of the second embodiment. Thus, the dispersion in off-angles of the nitride semiconductor free-standing substrate formed by the method for making a nitride semiconductor free-standing substrate according to the second embodiment is less than that of the free-standing substrate according to the comparative example. Accordingly, the nitride semiconductor free-standing substrate obtained in the second embodiment can be used to produce a light-emitting device such as LED, and LD having the small dispersion in the wavelength of light emission; and further the second embodiment can remarkably contribute to improve the yield ratio in case of making the light-emitting device.

Third Embodiment

Figure 4:
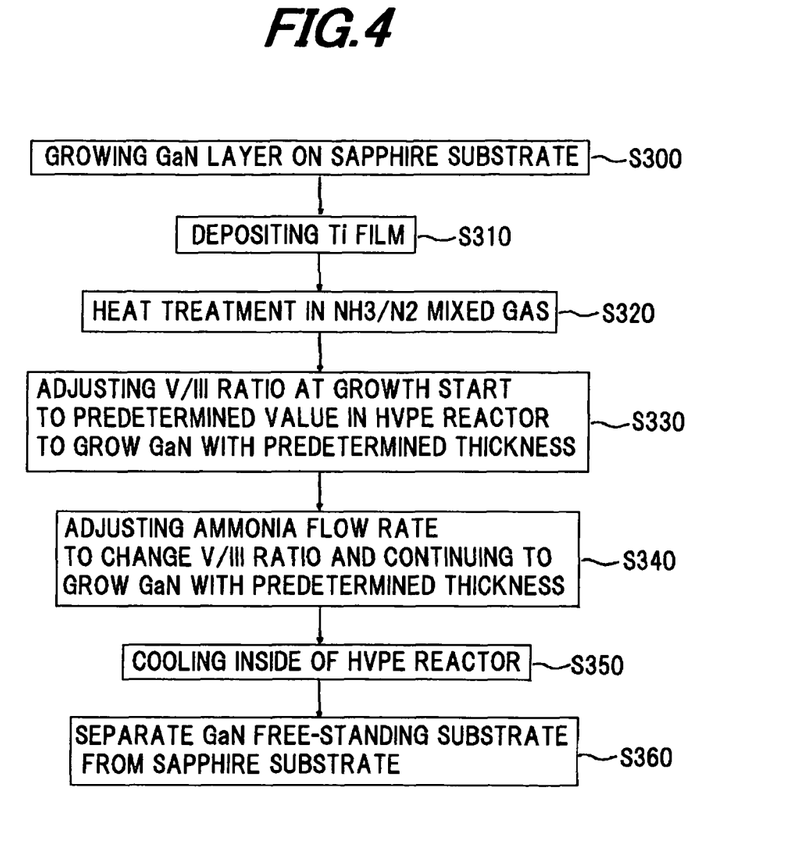
FIG. 4 is a flowchart illustrating a process of making a nitride semiconductor free-standing substrate according to a third embodiment of the invention.

FIG. 4 illustrates a flow process of making a nitride semiconductor free-standing substrate in the third embodiment of the invention.

The method for making a nitride semiconductor free-standing substrate of the third embodiment has substantially the same steps as that of the method for making a nitride semiconductor free-standing substrate according to the second embodiment except that the values of respective V/III ratios are different in both the embodiments in the case that the V/III ratio at the time of starting the growth of GaN crystals on a TiN layer is changed into a different value of V/III ratio after forming the GaN having a predetermined film thickness. Accordingly, the detailed explanation therefor is omitted except for the points of difference.

In the third embodiment, the V/III ratio at the time of starting growth being one of the growth conditions of GaN crystals which grow on a TiN layer is adjusted to be 15. As an example, GaN crystals are continuously grown by changing and adjusting a flow rate of $NH_3$ in such that the V/III ratio is 12 as an example after growing the GaN crystals having 500 μm thickness. The other steps, growth conditions and the like are the same as that of the second embodiment. As a result, a GaN free-substrate having 800 μm thickness and the surface thereof is flat unlike the GaN free-standing substrate according to the second embodiment is obtained.

Specifically, first, an undoped GaN layer is formed on a sapphire substrate by applying a MOVPE method (S300). Then, Ti is deposited on the GaN layer formed in accordance with a vacuum deposition method to form a Ti thin film having 20 nm thickness (S310). Thereafter, the sapphire substrate having the GaN layer on which the Ti thin film is formed is transferred to an electric reactor; and a mixed gas atmosphere of 20% of $NH_3$ and 80% of $H_2$ is established inside the electric reactor. The sapphire substrate having the GaN layer on which the Ti thin film is formed is heat-treated at 1050° C. for twenty minutes (S320).

In succession, a substrate holder 150 in a HVPE reactor 10 is loaded with the sapphire substrate having a void-assisted GaN layer and a void-formed TiN layer. Then, a GaN film having 500 μm thickness is formed on the sapphire substrate in such that a V/III ratio being a ratio of a V raw material and a III raw material is adjusted to be 15 (S330). Successively, the V/III ratio is changed into 12; and GaN crystals are grown continuously on the formed GaN film having 500 μm thickness up to 800 μm film thickness (S340). After completing the growth of the GaN crystals, the interior of the HVPE reactor 10 is cooled (S350). In the course of cooling the interior of the HVPE reactor, the GaN layer formed on the TiN layer exfoliates naturally from the boundary between the GaN layer and the void-assisted GaN layer (S360). As a result, a GaN free-standing substrate is formed as a nitride semiconductor free-standing substrate having 800 μm thickness.

The GaN free-standing substrate formed by the method for making a nitride semiconductor free-standing substrate according to the third embodiment exhibits a warpaged outline wherein the reverse face thereof shapes a convex surface. When a warpage amount of the GaN free-standing substrate is measured with use of a laser displacement meter, it is around 120 μm. Moreover, the surface 50 μm and the reverse face 350 μm of the resulting GaN free-standing substrate are polished to form a flat GaN free-standing substrate having 400 μm thickness. When off-angles in the GaN free-standing substrate are measured, the dispersion of the off-angles in the planes of the GaN free-standing substrate is 0.75 degree (the maximum value–the minimum value).

Furthermore, when the GaN free-standing substrate obtained by the method for making a nitride semiconductor free-standing substrate according to the third embodiment is cleaved to TEM-observe the cleaved surface. As a result, a number of streaked regions which are considered to be inversion domains are observed. A number of these streaked regions may be classified into a region wherein first inversion domains reaching up to the surface of the GaN free-standing substrate exist and another region wherein second domains which do not reach the surface of the GaN free-standing substrate exist. When the polarity detection by means of CBED is implemented, it is confirmed that these many regions are inversion domains. Moreover, it is recognized that the inversion domains of the GaN free-standing substrate according to the third embodiment exist inside the substrate in a section parallel to the surface of the GaN free-standing substrate at a density of $10/cm^2$, and on the surface of the substrate at a density of $0/cm^2$.

A GaN free-standing substrate to be formed has preferably 20 mm or more diameter and 200 μm thickness. This is because it is required to assure that a substrate has a thickness sufficient to handle as a nitride semiconductor free-standing substrate. Moreover, when the substrate has the smaller diameter, it exhibits the smaller amount of warpage in the case that the GaN free-standing substrate formed exhibits a warpage, provided that the curvature is identical in warpaged cases. Hence, the dispersion of off-angles due to the warpage of a substrate becomes small. Namely, advantages obtained by applying the method for making a nitride semiconductor free-standing substrate according to the first to third embodiments of the invention are low in the case that a diameter of the substrate is small.

On the other hand, when a substrate has the larger diameter, it results in the larger amount of warpage in the outer circumferential part of the substrate. Thus, the dispersion in off-angles due to a warpage of the substrate increases also, so that the advantages obtained by applying the method for making a nitride semiconductor free-standing substrate according to the first to third embodiments of the invention become remarkable. Namely, even when a diameter of a GaN free-standing substrate to be formed is 20 mm or more, the nitride semiconductor free-standing substrate having a small amount of warpage can be formed by applying the method for making a nitride semiconductor free-standing substrate according to the first to third embodiment of the invention.

Advantages of the Third Embodiment

The point of difference between the third embodiment and second embodiment is in that a V/III ratio at the time of starting the growth of GaN crystals on a TiN layer is retained at a predetermined value from the starting of growth up to reaching a predetermined film thickness, and after the GaN crystals grow to the predetermined film thickness, whether or not the V/III ratio is changed. In the third embodiment, after growing the GaN crystals to the predetermined film thickness, the growth condition is changed into such that inversion domains appear hardly, i.e. the V/III ratio is made to be in a low condition.

Namely, according to the method for making a nitride semiconductor free-standing substrate of the third embodiment, a growth condition wherein inversion domains appear easily is applied at the initial stage in growth of the nitride semiconductor crystals, and further a growth condition wherein inversion domains appear hardly is applied in case of growing the nitride semiconductor crystals on the surface side of the substrate. As a consequence, a nitride semiconductor free-standing substrate which has inversion domains inside nitride semiconductor crystals, while the inversion domains reach scarcely the surfaces of the nitride semiconductor crystals can be formed.

Therefore, according to the method for making a nitride semiconductor free-standing substrate of the third embodiment, a warpage of the nitride semiconductor free-standing substrate after exfoliating the heterosubstrate 1 is very small, and further the dispersion in off-angles due to the warpage of the free-standing substrate can be reduced. Consequently, the dispersion in the wavelength of a light emitted from the light-emitting device fabricated from the free-standing substrate can be reduced. In addition, a yield ratio of the light-emitting device fabricated from the free-standing substrate can be improved.

The inversion domains once appeared have such a behavior that they grow up to the surface of a crystal growth layer while retaining a predetermined region in the case that the growing condition is kept constant. In this connection, when the semiconductor layer of a light-emitting device is epitaxially grown on the free-standing substrate wherein the inversion domains reach the crystal surfaces, there arises such a problem that the surface of a region wherein the inversion domains exist coarsens. Thus, such a crystal growth condition that inversion domains do not appear has heretofore been selected.

However, the methods for making a nitride semiconductor free-standing substrate according to the first to third embodiments have been made based on the inventor(s)' following finding knowledge. Namely, a first finding knowledge is in that when inversion domains exist in nitride semiconductor crystals, the crystal lattice of a nitride semiconductor deviates in the thickness direction of the nitride semiconductor, whereby internal stress is moderated to suppress the warpage of the nitride semiconductor free-standing substrate. A second finding knowledge is in that there is a tendency of decreasing the warpage of a free-standing substrate in the case that the number of inversion domains per unit area is large, and the inversion domains extend up to the vicinities of crystal surfaces. Moreover, a third finding knowledge by the inventor(s) is in that when inversion domains reach the uppermost surface of a free-standing substrate, the surface of the free-substrate coarsens, so that it is desirable that the inversion domains are not allowed to reach up to the surface of the free-standing substrate, but the inversion domains are allowed to stop at the position where they do not reach the surface of the free-standing substrate, and the free-standing substrate is formed at such position.

Under the circumstances, a method for making a nitride semiconductor free-standing substrate wherein inversion domains exist inside the substrate is described in the first and second embodiments wherein the superiority of the free-standing substrate having inversion domains is described. In addition, a method for making nitride semiconductor free-standing substrate which has inversion domains inside the substrate, while the inversion domains do not reach the uppermost surface of the substrate is described in the third embodiment as the best making method of a nitride semiconductor free-standing substrate according to the invention.

The invention is not limited to the method for making a nitride semiconductor free-standing substrate described in the first to third embodiments, so far as the method involves a making process for producing inversion domains in the nitride semiconductor free-standing substrate. Furthermore, it is not required that the inversion domains remain in the nitride semiconductor free-standing substrate which is finally obtained, but it is sufficient that inversion domains appear in the making process. In other words, a nitride semiconductor free-standing substrate may be formed in such that a region having inversion domains and another region having no inversion domains are formed in the method for making a nitride semiconductor free-standing substrate, and then at least a part of the region having inversion domains is removed by polishing, etching and the like to form a nitride semiconductor free-standing substrate.

In addition, it may form an ingot of nitride semiconductor crystals by growing nitride semiconductor crystal having inversion domains on a heterosubstrate up to a thickness of around several mm. The formed ingot of nitride semiconductor crystal is sliced, whereby plural nitride semiconductor crystal free-standing substrates can be obtained.

Fourth Embodiment

The method for making a nitride semiconductor free-standing substrate according to the fourth embodiment has substantially the same processes as that of the third embodiment except that the values of respective V/III ratios are different in both the embodiments in the case that the V/III ratio at the time of starting the growth of GaN crystals on a TiN layer is changed into the V/II ratio having a different value after a GaN film having a predetermined thickness is formed. Hence, the detailed explanation therefor is omitted.

In the fourth embodiment, the V/III ratio at the time of starting growth being one of the growth conditions of GaN crystals which grow on a TiN layer is adjusted to be 20. As an example, GaN crystals are continuously grown by adjusting a flow rate of $NH_3$ in such that the V/III ratio is 12 after growing the GaN crystals having 500 μm thickness. The other steps, growth conditions and the like are the same as that of the third embodiment.

The GaN free-standing substrate formed by the method for making a nitride semiconductor free-standing substrate according to the fourth embodiment exhibits a warpaged outline wherein the reverse face thereof shapes a convex surface. When a warpage amount of the GaN free-standing substrate is measured with use of a laser displacement meter, it is around 20 μm. Moreover, the surface 50 μm and the reverse face 350 μm of the resulting GaN free-standing substrate are polished to form a flat GaN free-standing substrate having 400 μm thickness. When off-angles in the GaN free-standing substrate are measured, the dispersion of the off-angles in the planes of the GaN free-standing substrate is 0.23 degree (the maximum value–the minimum value).

Furthermore, when the GaN free-standing substrate obtained by the method for making a nitride semiconductor free-standing substrate according to the fourth embodiment is cleaved to TEM-observe the cleaved surface, a number of streaked regions which are considered to be inversion domains are observed. When the polarity detection by means of CBED is implemented, it is confirmed that these regions are inversion domains. Moreover, it is confirmed that the inversion domains of the GaN free-standing substrate according to the fourth embodiment exist inside the substrate in a section parallel to the surface of the GaN free-standing substrate at a density of $300/cm^2$, and on the surface of the substrate at a density of $0/cm^2$.

Fifth Embodiment

The method for making a nitride semiconductor free-standing substrate according to the fifth embodiment has substantially the same steps as that of the method for making a nitride semiconductor free-standing substrate according to the third embodiment except that the values of respective V/III ratios are different in both the embodiments in the case that the V/III ratio at the time of starting the growth of GaN crystals on a TiN layer is changed into a different value of V/III ratio after forming the GaN having a predetermined film thickness. Accordingly, the detailed explanation therefor is omitted except for the points of difference.

In the fifth embodiment, the V/III ratio at the time of starting growth being one of the growth conditions of GaN crystals which grow on a TiN layer is adjusted to be 40. As an example, GaN crystals are continuously grown by adjusting a flow rate of $NH_3$ in such that the V/III ratio is 12 after growing the GaN crystals having 500 μm thickness. The other steps, growth conditions and the like are the same as that of the third embodiment.

The GaN free-standing substrate formed by the method for making a nitride semiconductor free-standing substrate according to the fifth embodiment exhibits a warpaged outline wherein the reverse face thereof shapes a convex surface. When a warpage amount of the GaN free-standing substrate is measured with use of a laser displacement meter, it is around 5 μm. Moreover, the surface 50 μm and the reverse face 350 μm of the resulting GaN free-standing substrate are polished to form a flat GaN free-standing substrate having 400 μm thickness. When off-angles in the GaN free-standing substrate are measured, the dispersion of the off-angles in the planes of the GaN free-standing substrate is 0.1 degree (the maximum value–the minimum value).

Furthermore, when the GaN free-standing substrate obtained by the method for making a nitride semiconductor free-standing substrate according to the fifth embodiment is cleaved to TEM-observe the cleaved surface. As a result, streaked regions which are considered to be inversion domains are observed. When the polarity detection by means of CBED is implemented, it is confirmed that these regions are inversion domains. Moreover, it is confirmed that the inversion domains of the GaN free-standing substrate according to the fifth embodiment exist inside the substrate in a section parallel to the surface of the GaN free-standing substrate at a density of 600/cm$^2$, and on the surface of the substrate at a density of 200/cm$^2$.

Application Examples

Figure 5:
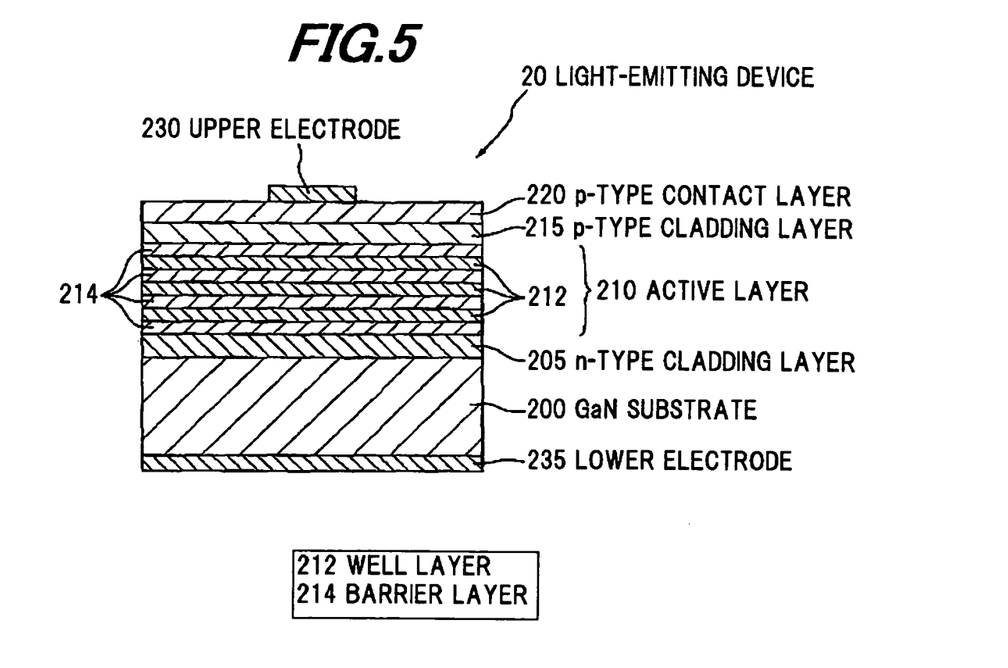
FIG. 5 is a sectional view showing a light-emitting device formed by applying the nitride semiconductor free-standing substrate made by the method for making a nitride semiconductor free-standing substrate according to the first to fifth embodiments of the invention.

FIG. 5 is a sectional view showing a light-emitting device formed by applying a nitride semiconductor free-standing substrate made by the method for making a nitride semiconductor free-standing substrate according to the first, second, third, fourth or fifth embodiment of the invention.

The light-emitting device according to an application example is composed of a GaN substrate 200 formed by the making method of a nitride semiconductor free-standing substrate according to the first, second, third, fourth or fifth embodiment, an n-type cladding layer 205 formed on the GaN substrate 200, an active layer 210 formed on the n-type cladding layer 205, a p-type cladding layer 215 formed on the active layer 210, and a p-type contact layer 220 formed on the p-type cladding layer 215.

Furthermore, the light-emitting device 20 is provided with a lower electrode 235 formed on substantially whole the surface of the GaN substrate 200 opposed to that on which the n-type cladding layer 205 is formed, and an upper electrode 230 formed on a predetermined region located on the surface of the p-type contact layer 220 opposed to that being in contact with the p-type cladding layer 215. Moreover, the active layer 210 according to an application example has a quantum well structure. As an example, the active layer 210 has a multiple quantum well structure including three layers of well layers 212, and four layers of barrier layers 214 wherein each of the well layers 212 is sandwiched between a pair of the barrier layers 214.

The quantum well structure of the active layer 210 may also be formed from a single quantum well structure or a strained quantum well structure. Moreover, the active layer 210 may also be formed from a double heterostructure, but not the quantum well structure.

Plural semiconductor layers of the light-emitting device 20 according to the application examples may be formed in accordance with a metal organic chemical vapor deposition (MOCVD) method as an example. The plural semiconductor layers may be formed by using, as an example, trimethyl gallium (TMG), trimethyl indium (TMI), and bicyclopentadienyl magnesium (Cp2Mg) being organic metal materials in accordance with the MOCVD method. For carrier gases fed together with the organic metal materials in case of forming the plural semiconductor layers, as an example, hydrogen and nitrogen are used.

Specifically, first, an n-type GaN layer is formed, as the n-type cladding layer 205 wherein a doping concentration of Si is 1×10$^{19}$ cm$^{-3}$, at 1050° C. on the GaN substrate 200 formed in the first, second, third, fourth, or fifth embodiment. A film thickness of the n-type cladding layer 205 is 4 μm as an example. Successively, an InGaN active layer is formed at 800° C. as the active layer 210 containing GaN barrier layers as three layers of barrier layers 214 and In$_{0.1}$Ga$_{0.9}$N well layers as four layers of well layers 212. A film thickness of the In$_{0.1}$Ga$_{0.9}$N well layer is 3 nm as an example, while a film thickness of the GaN barrier layer is 10 nm as an example.

Furthermore, a p-type Al$_{0.1}$Ga$_{0.9}$N cladding layer for the p-type cladding layer 215 and a p-type GaN contact layer for the p-type contact layer 220 are formed in this order. As a p-type dopant, Mg is used as an example. In addition, the upper electrode 230 and the lower electrode 235 are formed from a metallic material containing Ti, Ni, Al or the like.

Table 1 indicate results in the dispersion of emission wavelengths of the light-emitting devices fabricated by using the nitride semiconductor free-standing substrates formed in the first through fifth embodiments and the nitride semiconductor free-standing substrate formed in the comparative example.

TABLE 1

|  | I.D. density inside substrate (number/cm$^2$) | I.D. density on substrate surface (number/cm$^2$) | Warpage amount (μm) | Dispersion in off-angles (degrees) | Dispersion in emission wavelengths of light-emitting device (nm) | Surface morphology |
| --- | --- | --- | --- | --- | --- | --- |
| First embodiment | 100 | 100 | 100 | 0.7 | 16 | ○ |
| Second embodiment | 300 | 300 | 10 | 0.2 | 11 | X |
| Third embodiment | 10 | 0 | 120 | 0.75 | 18 | ◎ |
| Fourth embodiment | 300 | 0 | 20 | 0.23 | 12 | ◎ |
| Fifth embodiment | 600 | 200 | 5 | 0.1 | 9 | ○ |
| Comparative Example | 0 | 0 | 150 | 0.9 | 24 | ◎ |

In Table 1, the meanings of symbols in the column of the surface morphology are as follows. Namely, the double circle (◎) indicates a substrate on which surface roughening is scarcely observed. The single circle (○) indicates a substrate on which surface roughening is slightly observed. Besides, the christcross (×) indicates a substrate on which surface roughening is remarkably observed. When surface roughening appears remarkably, the yield ratio of a light-emitting device decreases.

The light-emitting devices shown in FIG. 5 are fabricated by using the nitride semiconductor free-standing substrates formed in the first through fifth embodiments and the nitride semiconductor free-standing substrate formed in the comparative example. The dispersion in emission wavelengths is measured in accordance with EL measurement. As a consequence, such result that a light-emitting device having a small dispersion in off-angles brings about a small dispersion in emission wavelengths is obtained. This result is due to the fact that when a free-standing substrate having inversion domains is applied, the warpage of the substrate decreases so that the dispersion in off-angles in the substrate plane decreases.

As is understood by referring to Table 1, a warpage amount of the free-standing substrate can be reduced in the case that a GaN free-standing substrate has inversion domains at a density of from $10/cm^2$ or more to $600/cm^2$ or less in a section parallel to the surface of the free-standing substrate, i.e. inside the substrate as in the case of the present embodiments in comparison with that of the comparative example. When a free-standing substrate has a small warpage (for example, in case of a warpage amount of 5 μm to 120 μm), the dispersion in emission wavelengths of a light-emitting device may be retained within a range of from 9 nm to 18 nm. The morphology of substrate surface may be made to be a good condition in the case that the surface of the free-standing substrate has inversion domains at a density of $0/cm^2$ or more to $200/cm^2$ or less.

Although the invention has been described hereinabove in accordance with the present embodiments, the invention claimed in the appended claims is not restricted by the above-described embodiments. Furthermore, it is to be noted that all the combinations of the characteristic features described in the embodiments are not necessarily required for the means of solving the problems to be solved by the invention.

What is claimed is:

1. A nitride semiconductor free-standing substrate, consisting of:
    a continuously-grown nitride semiconductor crystal; and
    an inversion domain with a density of not less than $10/cm^2$ and not more than $600/cm^2$ in a section parallel to a surface of the substrate and inside the substrate,
    wherein an inversion domain density on the surface of the substrate is less than an inversion domain density inside the substrate.

2. The nitride semiconductor free-standing substrate according to claim 1, wherein the surface of the substrate comprises an inversion domain with a density of not less than $0/cm^2$ and not more than $200/cm^2$.

3. A method for making a nitride semiconductor free-standing substrate, said method comprising:
    continuously growing a nitride semiconductor crystal on a heterosubstrate, said nitride semiconductor crystal comprising an inversion domain with a density of not less than $10/cm^2$ and not more than $600/cm^2$ by adjusting a growth condition at an initial growth stage of the nitride semiconductor crystal; and
    separating the grown nitride semiconductor crystal from the heterosubstrate to form the nitride semiconductor free-standing substrate,
    wherein an inversion domain density on a surface of the substrate is less than an inversion domain density inside the substrate.

4. The method according to claim 3, wherein said growing the nitride semiconductor crystal comprises:
    after growing the nitride semiconductor crystal comprising the inversion domain on the heterosubstrate, continuously growing the nitride semiconductor crystal comprising an inversion domain with a density of not less than $0/cm^2$ and not more than $200/cm^2$ on a surface of the nitride semiconductor crystal.

5. The method according to claim 3, further comprising:
    removing a part of the nitride semiconductor crystal comprising the inversion domain in the nitride semiconductor free-standing substrate from the separated nitride semiconductor free-standing substrate after the separating of the grown nitride semiconductor crystal.

6. The nitride semiconductor free-standing substrate according to claim 1, wherein an off-angle of the substrate is 0.1° or more and 0.7° or less.

7. The nitride semiconductor free-standing substrate according to claim 1, wherein a warpage amount of the substrate is 5 μm to 120 μm.

8. The nitride semiconductor free-standing substrate according to claim 1, wherein said density comprises an inversion domain density.

9. The nitride semiconductor free-standing substrate according to claim 8, wherein said inversion domain density is different from a dislocation density.

10. The nitride semiconductor free-standing substrate according to claim 8, wherein said inversion domain density is defined as a number of inversion domains per unit area.

11. The nitride semiconductor free-standing substrate according to claim 1, further comprising:
    another inversion domain having a different polarity than a polarity of said inversion domain.

12. The method according to claim 3, wherein said density comprises an inversion domain density.

13. The method according to claim 12, wherein said inversion domain density is different from a dislocation density.

14. The method according to claim 12, wherein said inversion domain density is defined as a number of inversion domains per unit area.

15. The method according to claim 12, wherein said nitride semiconductor crystal further comprises another inversion domain that has a different polarity than a polarity of said inversion domain.

* * * * *